United States Patent
Pfendler et al.

(10) Patent No.: US 6,326,917 B1
(45) Date of Patent: Dec. 4, 2001

(54) SCANNER-CONTROL DEVICE

(75) Inventors: Thomas Pfendler, Gerlingen; Siegbert Steinlechner, Leonberg, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/554,479
(22) PCT Filed: May 25, 1999
(86) PCT No.: PCT/DE99/01532
    § 371 Date: May 15, 2000
    § 102(e) Date: May 15, 2000
(87) PCT Pub. No.: WO99/63362
    PCT Pub. Date: Dec. 9, 1999

(30) Foreign Application Priority Data

May 29, 1998 (DE) .............................. 198 24 037

(51) Int. Cl.⁷ ...................................................... H01Q 3/22
(52) U.S. Cl. .......................... 342/371; 342/137; 342/175; 342/372; 359/896
(58) Field of Search ............................ 359/896; 342/137, 342/175, 371, 372

(56) References Cited

U.S. PATENT DOCUMENTS

| | | |
|---|---|---|
| 5,543,799 | 8/1996 | Heger . |
| 5,563,605 | 10/1996 | McEwan . |
| 5,757,320 | 5/1998 | McEwan . |

*Primary Examiner*—James Phan
(74) *Attorney, Agent, or Firm*—Kenyon & Kenyon

(57) ABSTRACT

A scanner-control device for scanning an echo signal formed by returning transmit pulses, includes a clock generator, which triggers a pulse shaper for the transmit pulses and a further pulse shaper for scanning pulses. The scanner-control device also includes setting member for modifying a delay time of the scanning pulses, so that the echo signal can gradually be reconstructed from the returning transmit pulses. Temporally stable transmit pulses and scanning pulses, that are also in a temporal relation to each other, are achieved through the fact that the pulse shaper for the transmit pulses is an element of a first closed loop having a summing point and having a controller, and the further pulse shaper is an element of a second closed loop having a further summing point and a further controller, and that the summing point and the further summing point have supplied to them an identical setpoint value, and the further summing point has additionally a further setpoint value, which is varied to alter the delay time.

8 Claims, 3 Drawing Sheets

SCANNER-CONTROL DEVICE

FIELD OF THE INVENTION

The present invention relates to a scanner-control device for scanning an echo signal formed by returning transmit initial pulses, including a clock generator, which triggers a pulse shaper for the transmit pulses and a further pulse shaper for scanning pulses, and a setting member (e.g., an ajustment element) for modifying a delay time $\Delta T$ of the scanning pulses, so that the echo signal can gradually be reconstructed from the returning transmit pulses.

BACKGROUND INFORMATION

A scanner-control device of this type has applications in many technical areas, for example in a nonhomogeneous medium or on boundary surfaces, to receive reflected echo signals from transmit pulses and to evaluate them. Through an echo-time (e.g., delay time) measurement, information can be derived regarding, for example, the length of the distance that the signal has traveled. Examples of applications include distance measuring using sound, radar, or light waves. Furthermore, the echo signal shape can give information about the structure of the carrying medium, such as in determining the fog density in the atmosphere using light waves, or in seismic measurements of plate motion in the earth, or in measurements of material layers in pipes and walls using radar, to name only a few examples.

In most cases, an evaluation in real time, i.e., at the speed at which the echo signals arrive, is impossible due to the insufficient speed of the evaluation circuit. This is particularly true of the evaluation of signals that expand at the speed of light. Therefore, for this purpose, scanning devices are used in which the echo signal is scanned in a step-by-step manner, resulting in the desired time extension for the evaluation. In a scanning system of this type, a clock generator periodically triggers a pulse shaper, which sends transmit pulses to the system to be investigated. The returning echo signal is scanned in a scanner after a variable time $\Delta T$. The scanning value associated with a time point, after delay $\Delta T$, receives further signal processing. By varying delay $\Delta T$, the entire echo signal can gradually be reconstructed.

The conventional methods for generating scanning pulses delayed by a delay $\Delta T$ are either imprecise or very expensive, particularly for very small increments and/or great variation ranges.

In U.S. Pat. No. 5,543,799, a local-range radar is described in which a variable, voltage-controlled delay of the transmit pulse takes place. The delay in certain circumstances is not a linear function of a control voltage and is therefore imprecise.

The Analog Devices Company offers a digital circuit arrangement having a controllable time delay (AD9501, AD9505), the linearity being maintained through generating a highly precise frame function.

SUMMARY OF THE INVENTION

The present invention relates to refining a scanner-control device so that the transmit pulses and the delayed scanning pulses are generated very precisely, and the echo signal can be reproduced very precisely.

The pulse shaper for the transmit pulses is an element of a first closed loop having a summing point and a controller (e.g., a closed-loop controller), and the further pulse shaper is an element of a second closed loop having a further summing point and a further controller, and that the summing point and a further summing point have supplied to them an identical setpoint value, and the further summing point additionally has supplied to it a further setpoint value, which is varied in order to modify the delay time. Through the feedback control of the transmission of the transmit pulses and of the scanning pulses, in this manner transmit pulses and scanning pulses are generated in a precisely prescribed manner, the time relation of one to the other being maintained in a stable manner.

A stable feedback control in a simple design of the control device is achieved through the fact that the pulse shaper and the further pulse shaper, in each case, have at least one switching element which at a given threshold voltage carries out a switchover, and that a control direct voltage applied to the switching element is controlled by the controller and the further controller.

A control deviation is reliably detected, for example, due to the fact that the setpoint value supplied to the summing point and a further summing point as well as the further setpoint value are direct voltages.

If provision is made that the further setpoint value is a direct voltage formed by a counter and a D/A converter connected downstream of the counter, and that the counter is clocked using a clock generator, then a modification of the delay is achieved that can be quantized very precisely, values of less than 50 ps being reproducible.

An exemplary embodiment that is also suitable for rapidly changing control voltages and using which a large usable frequency range is achieved for the control signal, the controller having only to compensate for errors in the selected weighting and for effects from non-linearities, arises from the fact that in the second closed loop between the further controller and the further timing (e.g., echo-time) element a summing element is provided, to which the further setpoint value is supplied.

A simple design for generating and controlling the transmit pulses and the scanning pulses is achieved through the fact that the switching element has an AND gate circuit, one input of which receiving the clock signal of the clock generator and the other input of which being connected to an RC, RL, or LC element and receiving an input signal having the superimposed control direct voltage. By superimposing the control direct voltage, the echo time of the arrangement can be changed, since the gate circuit always switches at the same switching point, the delay shifting in a defined manner using the control voltage. In this context, it is an advantageous measure that the other input has supplied to it, as the input signal, the inverted clock signal having the superimposed control direct voltage.

A further advantageous configuration of the control device for a stable, highly precise feedback control of the transmit pulses and scanning pulses arises from the fact that the switching element has a NAND gate circuit and a flip-flop, to whose clock input the clock signal of the clock generator is supplied and whose one output is connected via a timing element to an input of the NAND gate circuit and is connected to the controller or the further controller, that the other input of the NAND gate circuit via a further timing element is supplied, on the one hand, with the clock signal and, on the other hand, with the control direct voltage superimposed on the clock signal, and that the output of the NAND gate circuit is connected to a reset input of the flip-flop, and trailing edges of the output signal of the NAND gate circuit function directly to trigger the transmit pulses or the scanning pulses. In this specific embodiment, there is no need for a further circuit that generates the transmit or scanning pulses from the trailing edge of the signal supplied to the controller. The position of the trailing edge, which determines the transmission time point and scanning time point, is in this embodiment also feedback controlled.

DETAILED DESCRIPTION

Figure 1:
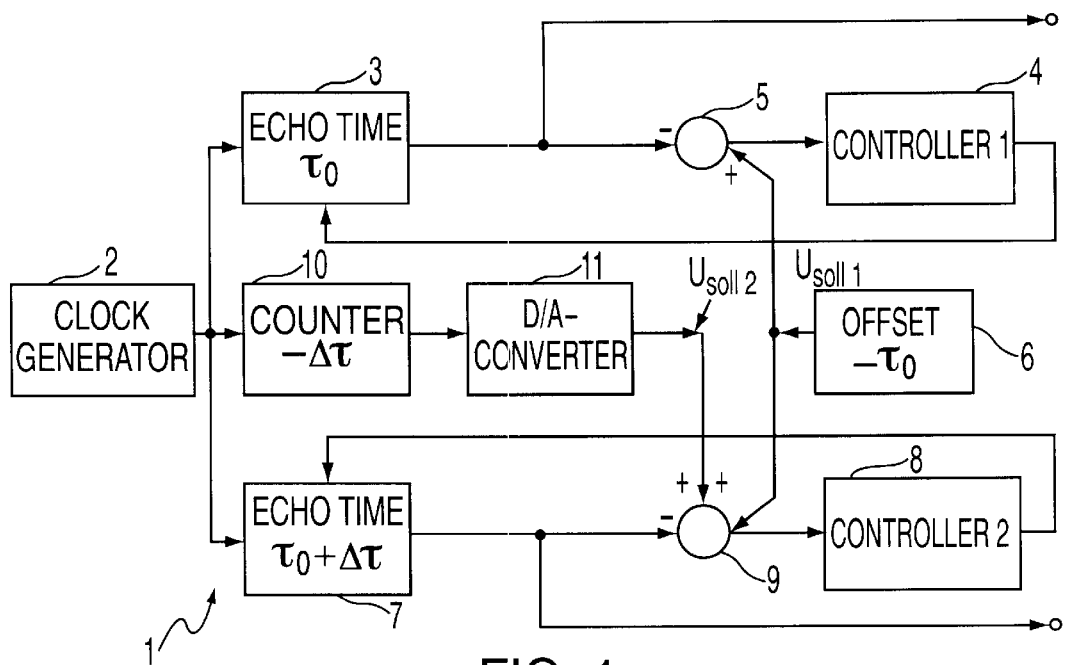
FIG. 1 shows a block diagram for a first exemplary embodiment of the scanner-control device according to the present invention.

FIG. 1 depicts schematically a first exemplary embodiment for a scanner-control device 1 having a clock generator 2 that transmits clock pulses to a timing element 3 for generating pulses of a delay $T_0$ and to a further timing element 7 for transmitting further pulses of a delay $T_0+\Delta T$, and to a counter 10 for generating a delay time $\Delta T$.

The pulses of echo time $T_0$ are supplied via a summing point 5 to a feedback controller 4, whose output is coupled back to timing element 3. Summing point 5, in addition, has supplied to it, as a setpoint value, a setpoint voltage $U_{setpoint1}$ from a control element 6. The output signal of timing element 3 is divided and is retrieved for forming the transmit pulses having the trailing edge of pulses of delay $T_0$, as can be seen from the pulse diagram depicted in FIG. 4.

Accordingly, the output signal of further timing element 7 is controlled via a further summing point 9 and via a further controller 8, whose output is fed back to further timing element 7. Further summing point 9 also has supplied to it setpoint voltage $U_{setpoint1}$ and additionally a further setpoint voltage $U_{setpoint2}$, which is generated through a digital-analog conversion by D/A converter 11 of the counting pulses emitted by counter 10. The output signal of further timing element 7 is divided in order to generate, through its trailing pulse edges, the scanning pulses that are time delayed by delay $\Delta T$, as is also clear from FIG. 4.

Figure 2:
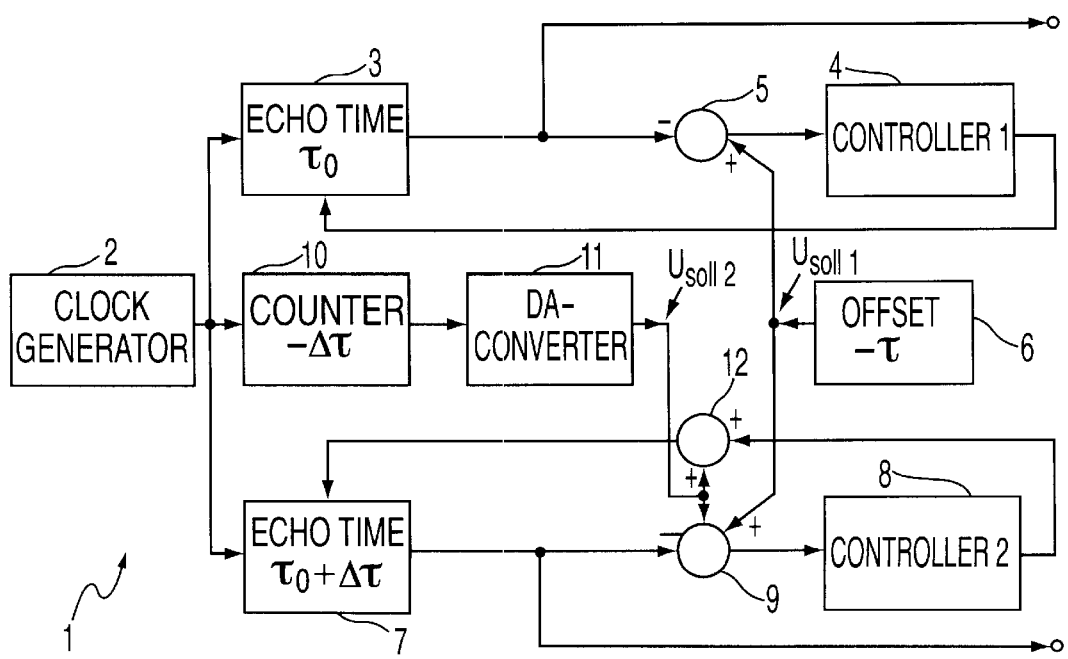
FIG. 2 shows a further exemplary embodiment of the scanner-control device.

FIG. 2 depicts a modified embodiment of the scanner-control unit 1 depicted in FIG. 1. In this context, additional setpoint voltage $U_{setpoint2}$ is further supplied to a summing element 12 arranged in the feedback branch between further controller 8 and further timing element 7.

Figure 3:
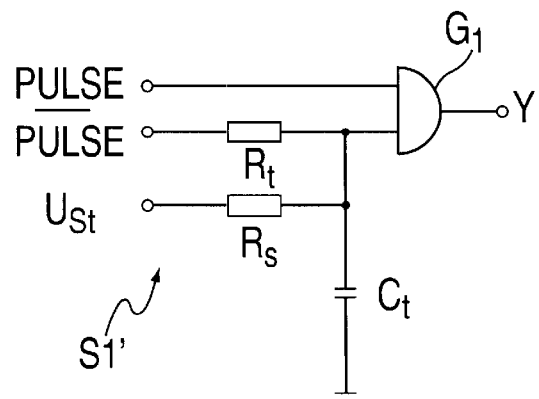
FIG. 3 shows a switching element for the timing elements illustrated in FIGS. 1 and 2.

FIG. 3 depicts a switching element S1', which can be used for generating the controlled output pulses in timing element 3 and in further timing element 7. Switching element S1' has an AND gate circuit G1, to whose first input the clock signal pulse of clock generator 2 is supplied and to whose second input the inverted clock signal of clock generator 2 is supplied via a resistor $R_t$, a superimposed control direct voltage $U_{ST}$ also being supplied via a control resistor $R_S$ and the second input being connected via a capacitor $C_t$ to ground, it being possible using resistors $R_T, R_S$ and capacitor $C_t$ to set an appropriate echo time $T_0$ or an echo time having delay $T_0+\Delta T$.

Figure 4:
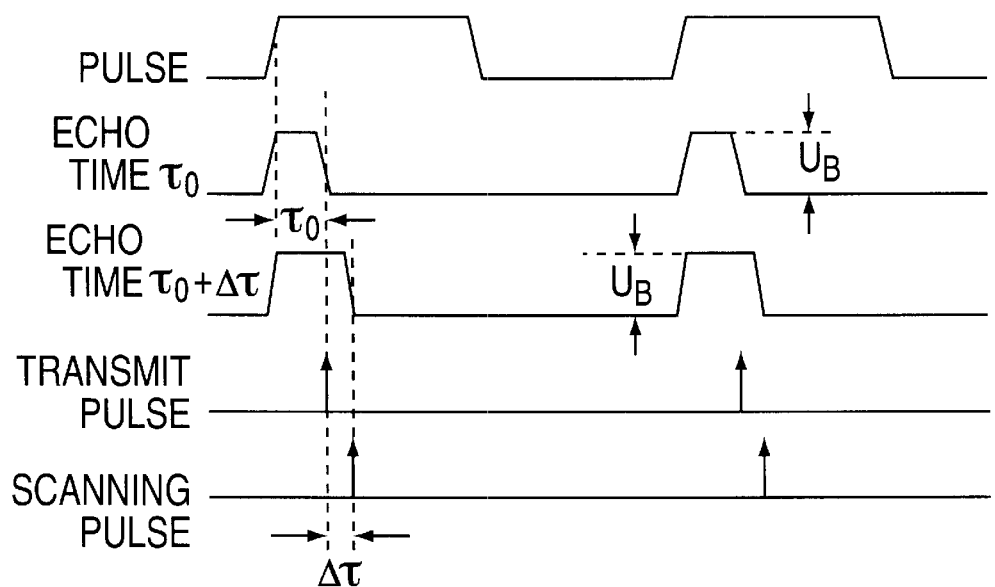
FIG. 4 shows a pulse diagram for various pulses arising in FIGS. 1, 2 and 3.

As can be seen from FIG. 4, beginning with the rising clock-pulse edge of the clock signal pulse, the two rectangular signals of duration $T_0$ or $T_0+\Delta T$ are generated, $T_0$ being a fixed and $\Delta T$ a variable delay that can be influenced in a more or less linear fashion by control direct voltage $U_{ST}$. The amplitude of the signals is $U_B$.

In switching element S1', the clock signal in accordance with FIG. 4 is provided to the one input of the AND gate circuit G1 and the inverted clock signal to the other input, delayed by delay element $R_t C_t$. There arises a positive pulse, as is seen in FIG. 4, third line. By superimposing control direct voltage $U_{ST}$, the echo time of the arrangement can be changed, since AND gate circuit G1 always switches at the same switching point, but the delayed clock signal, due to control direct voltage $U_{ST}$, shifts in accordance with the voltage.

Instead of AND gate circuit G1, in principle NAND, OR, or NOR gate circuits can be used. It is advantageous if the clock and inverse clock signal emanate from a flip-flop having complementary outputs, as a result of which no shift of the two signals with respect to each other arises.

As the control element for echo time $T_0+\Delta T$ or the controllable delay $\Delta T$, consideration can also be given to rapid CMOS, ECL, or TTL gate circuits in connection with RC, RL, or LC elements. The control of the echo time, in this context, can take place by changing the components R, L, and C involved. A voltage control of a capacitor can occur, e.g., through the use of a capacitor diode, and a voltage control of a resistor through the use of a field-effect transistor.

Achieved delay $\Delta T$, as a function of control voltage $U_{ST}$, is usually nonlinear in all cited methods. Therefore, a feedback control of the echo time is carried out by scanner-control devices 1 depicted in FIG. 1 and FIG. 2, in accordance with the following method:

Using analog averaging in an integrator or low pass, the average direct component of the signals having duration $T_0$ or $T_0+\Delta T$ and having amplitude $U_B$ is measured and, in each case, is compared with the prescribed setpoint value $U_{setpoint1}$ or $U_{setpoint1}+U_{setpoint2}$. Controller 4 and further controller 8 modify the corresponding control-direct voltage such that the average value is equal to the corresponding setpoint value. The rate of repetition of the pulses should be $f_0$. The following then applies:

$$U_B \cdot T_0 \cdot f_0 = U_{setpoint1}$$

$$U_B \cdot (T_0+\Delta T) \cdot f_0 = U_{setpoint1}+U_{setpoint2}.$$

In this manner, it is achieved that fixed echo time $T_0$ of the first signal active at the output of timing element 3 becomes proportional to the fixedly prescribed first setpoint voltage $U_{setpoint1}$. Additional, variably controllable delay $\Delta T$ of the second signal active at the output of further timing element 7 becomes proportional to further setpoint voltage $U_{setpoint2}$, independent of component tolerances. If setpoint voltages $U_{setpoint1}$ and $U_{setpoint2}$ are formed in each case from voltage amplitude $U_B$ of a gate operating voltage so as to be proportional, then the dependency of the gate operating voltage also falls away.

Correspondingly, in the exemplary embodiments according to FIG. 1 and FIG. 2, in controllers 4 and 8, setpoint voltage $U_{setpoint\ 1}$, which corresponds to an echo time $T_0$, is prescribed as the setpoint value. Further controller 8 receives, in an additive manner, setpoint voltage $U_{setpoint2}$, corresponding to echo time $\Delta T$, as the setpoint value. The control of the additional echo time takes place via counter 10 having D/A converter 11 connected downstream. The quantization of delay ΔT, achieved in this manner, can be selected very precisely, it being possible to reproduce values of under 50 ps.

In a further exemplary embodiment depicted in FIG. 2, controlling setpoint voltage $U_{setpoint2}$ acts not only on the controller, but also, when provided with a corresponding weighting, directly on the control input of further timing element 7. Thus further controller 8 only has to compensate for errors in the selected weighting and for the effects of non-linearities, the usable frequency range for controlling setpoint signal $U_{setpoint2}$ being significantly enlarged.

Figure 5:
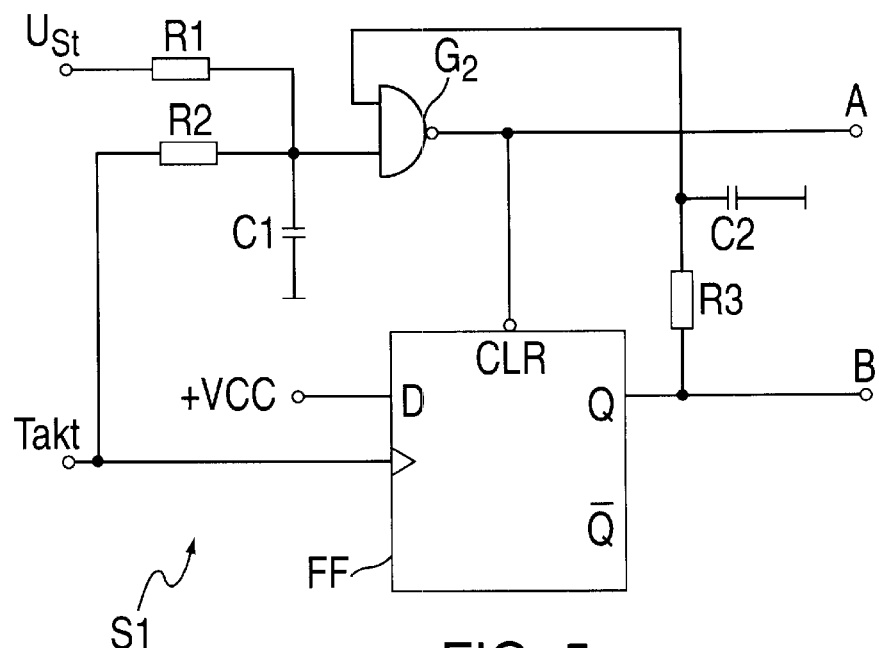
FIG. 5 shows a further switching element for the timing elements in accordance with FIGS. 1 and 2.

In place of switching element S1' depicted in FIG. 3, provision can be made in timing element 3 or further timing element 7 for switching element S1 in accordance with FIG. 5, which functions to generate the transmit pulses or scanning pulses and to generate pulses of amplitude $U_B$ and duration $T_0$ or $T_0+\Delta T$, supplied to the controller, for the purpose of controlling echo times $T_0$ or $T_0+\Delta T$.

Switching element S1 has a NAND gate circuit G2, to whose first input control direct voltage $U_{ST}$ is applied via a resistor R1 and clock signal pulse is applied via a resistor R2, the first input being connected to ground via a capacitor C1. In addition, switching element S1 has a flip-flop FF, at whose clock input the clock signal pulse is applied and whose non-inverted output Q is connected via a resistor R3 to the further input of NAND gate circuit G2, which is connected to ground via a further capacitor C2. The output of NAND gate circuit G2 is connected to a feedback input of flip-flop FF.

In response to the rising trailing edge of the clock signals pulse, output Q of flip-flop FF is set at logic 1. Shortly thereafter, further capacitor C2 is charged at logic 1, i.e., at a voltage that NAND gate circuit G2 recognizes as logic 1. Since time constant R3C2 is smaller than the time constant formed using resistors R1 and R2 and capacitor C1, capacitor C1 is charged at logic 1 somewhat later. The time point at which the voltage at capacitor C1 reaches logic level 1 can be influenced by analog control direct voltage $U_{ST}$ supplied from outside.

After both inputs of NAND gate circuit G2 are at logic 1, the signal at an output A for the transmit signal becomes logic 0. In this manner, a resetting of flip-flop FF is affected (Q=0) and subsequently output A is again set at logic 1. Resistor R3 and capacitor C2, in this context, effect a sufficient duration of the reset signal at the output of NAND gate circuit G2. The process is repeated in the next rising clock pulse edge.

Figure 6:
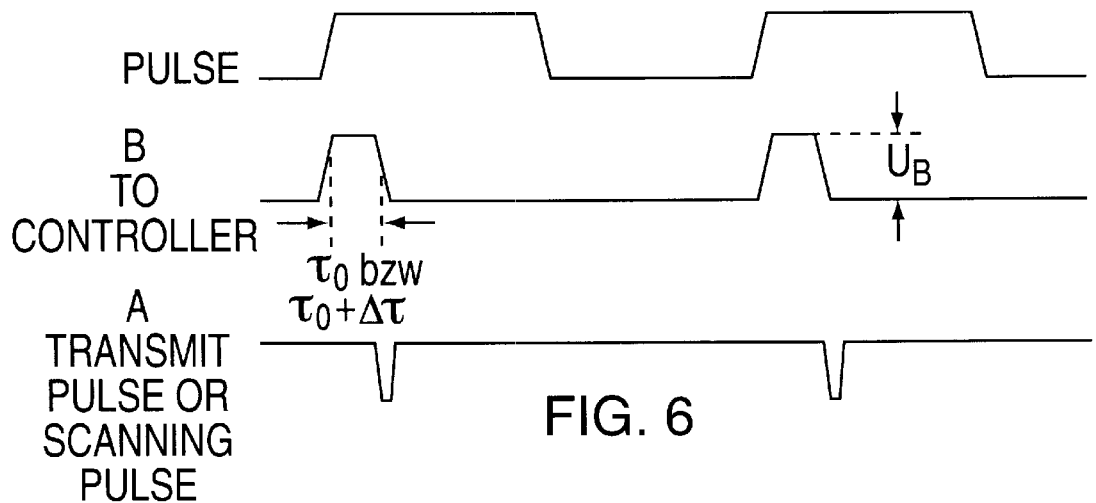
FIG. 6 shows a pulse diagram for pulses arising in the switching element in accordance with FIG. 5.

The trailing edge of the signal at output A functions directly to trigger a transmitter emitting the transmit signals or a scanner emitting the scanning signals. The signal at non-inverting output Q of flip-flop FF or at output B is supplied to the feedback control which sets the pulse width of the pulses sent to controller 4 or 8 at the desired value $T_0$ or $T_0+\Delta T$. FIG. 6 depicts a time diagram of the clock signals pulse and of the signals at outputs A and B.

The advantages of this switching element S1 or of the timing elements 3 that are constructed on this basis lie in the fact that it has two separated outputs A (for the transmit or scanning pulses) and B (pulses for the feedback control). In this manner, further switching segments for the generation of the actual transmit or scanning pulses can be omitted, and high precision can be attained. The signal at an output B itself is not as a rule suited for driving the transmitter or the scanner (e.g., in the use of step-recovery diodes), since B has a variable length. The transmitter and scanner usually require short pulses of constant duration.

The position of the trailing edge of the signal at output A, determining the transmit or scanning time point, is also controlled in the design according to FIG. 5, yielding an essential advantage.

What is claimed is:

1. A scanner-control device for scanning an echo signal, the echo signal being formed by returning transmit pulses, comprising:

a clock generator periodically triggering (a) a pulse shaper for transmit pulses and (b) a further pulse shaper for scanning pulses; and a setting member modifying a delay time of the scanning pulses so that the echo signal can gradually be reconstructed from the returning transmit pulses, wherein the pulse shaper is an element of a first closed loop including a summing point and a feedback control, the further pulse shaper being an element of a second closed loop including a further summing point and a further controller, the summing point and the further summing point receiving an identical setpoint value, the further summing point also receiving a further setpoint value which is varied to alter the delay time.

2. The control device according to claim 1, wherein each of the pulse shaper and the further pulse shaper includes at least one switching element, the at least one switching element carrying out a switchover at a predetermined threshold voltage, a control direct voltage being applied at the at least one switching element, the control direct voltage being controlled using the controller and the further controller.

3. The control device according to claim 1, wherein the setpoint value and the further setpoint value are direct voltages.

4. The control device according to claim 1, wherein the further setpoint value is a direct voltage formed by a counter and a D/A converter connected downstream of the counter, the counter being clocked using the clock generator.

5. The control device according to claim 1, further comprising:

a summing element being situated in the second closed loop between the further controller and a further timing element, the further setpoint value being supplied to the summing element.

6. The control device according to claim 2, wherein the at least one switching element includes an AND gate circuit, the clock signal of the clock generator being supplied to a first input of the AND gate circuit, a second input of the AND gate circuit being connected to one of an RC, RL and LC element, the AND gate circuit receiving an input signal having a superimposed control direct voltage.

7. The control device according to claim 6, wherein the second input receives, as the input signal, an inverted clock signal having the superimposed control direct voltage.

8. The control device according to claim 7, wherein the at least one switching element includes a NAND gate circuit and a flip-flop, a clock input of the flip-flop receiving the clock signal of the clock generator, a first output of the flip-flop being connected, via a timing element, to a first input of the NAND gate circuit and leading to one of the controller and the further controller, and wherein a second input of the NAND gate circuit is supplied, via a further timing member, with the clock signal and the control direct voltage which is superimposed on the clock signal, an output of the NAND gate circuit being connected to a reset input of the flip-flop, trailing edges of an output signal of the NAND gate circuit functioning directly to trigger one of the transmit pulses and the scanning pulses.

* * * * *